(12) United States Patent
Chueh et al.

(10) Patent No.: US 9,680,454 B2
(45) Date of Patent: Jun. 13, 2017

(54) FREQUENCY TRIPLER AND LOCAL OSCILLATOR GENERATOR

(71) Applicant: MEDIATEK INC., Hsin-Chu (TW)

(72) Inventors: Tzu-Chan Chueh, Hsinchu County (TW); Yu-Li Hsueh, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/720,838

(22) Filed: May 25, 2015

(65) Prior Publication Data
US 2016/0118964 A1    Apr. 28, 2016

Related U.S. Application Data

(60) Provisional application No. 62/069,489, filed on Oct. 28, 2014.

(51) Int. Cl.
    H03B 19/00    (2006.01)
    H03K 5/00     (2006.01)
    H03B 19/14    (2006.01)

(52) U.S. Cl.
    CPC ......... H03K 5/00006 (2013.01); H03B 19/14 (2013.01)

(58) Field of Classification Search
    USPC .................................. 327/100–123
    See application file for complete search history.

(56) References Cited

U.S. PATENT DOCUMENTS

| | | | |
|---|---|---|---|
| 5,077,546 A | 12/1991 | Carfi | |
| 5,412,351 A * | 5/1995 | Nystrom | H03B 27/00 329/305 |
| 5,706,311 A * | 1/1998 | Koyama | H04L 27/362 332/103 |
| 6,240,142 B1 * | 5/2001 | Kaufman | H03C 3/403 329/304 |
| 6,564,045 B1 * | 5/2003 | Fransis | H03D 7/1433 455/189.1 |

(Continued)

OTHER PUBLICATIONS

Chen, "Design and analysis of CMOS subharmonic injection-locked frequency triplers", IEEE Transactions on Microwave Theory and Techniques, vol. 56, No. 8, pp. 1869-1878, Aug. 2008.

(Continued)

Primary Examiner — Brandon S Cole
(74) Attorney, Agent, or Firm — Wolf, Greenfield & Sacks, P.C.

(57) ABSTRACT

A frequency tripler includes a double-frequency in-phase signal generator, a double-frequency quadrature signal generator and a mixer. The double-frequency in-phase signal generator is arranged for receiving at least an in-phase signal and a quadrature signal to generate a double-frequency in-phase signal whose frequency is twice that of the in-phase signal or the quadrature signal; the double-frequency quadrature signal generator is arranged for receiving at least the in-phase signal and the quadrature signal to generate a double-frequency quadrature signal whose frequency is twice that of the in-phase signal or the quadrature signal; and the mixer is arranged for receiving the in-phase signal, the quadrature signal, the double-frequency in-phase signal and the double-frequency quadrature signal to generate an output signal whose frequency is triple that of the in-phase signal or the quadrature signal.

18 Claims, 3 Drawing Sheets

(56) References Cited

U.S. PATENT DOCUMENTS

| | | | |
|---|---|---|---|
| 7,978,785 B2* | 7/2011 | Leifso | H03B 19/14 327/122 |
| 8,369,820 B2* | 2/2013 | Petrovic | H03D 7/00 455/323 |
| 2003/0011861 A1* | 1/2003 | Casagrande | H03C 3/403 455/313 |
| 2008/0030244 A1* | 2/2008 | Leifso | H03B 19/14 327/122 |
| 2008/0258783 A1* | 10/2008 | Petrovic | H03B 19/06 327/119 |
| 2009/0143027 A1* | 6/2009 | Mirzaei | H03D 7/1441 455/90.2 |
| 2009/0243690 A1* | 10/2009 | Zhang | H03L 7/099 327/295 |
| 2011/0227612 A1 | 9/2011 | Chiesa | |
| 2011/0256839 A1* | 10/2011 | Fukuoka | H03F 1/0294 455/127.2 |
| 2012/0057650 A1* | 3/2012 | Felix | H04L 27/367 375/296 |
| 2012/0206285 A1* | 8/2012 | Khlat | H03M 3/40 341/155 |

OTHER PUBLICATIONS

Ghouchani, "A Wideband Millimeter-Wave Frequency Doubler-Tripler in 0.13-um CMOS," IEEE RFIC Symposium, 2010.
Jackson, "A frequency tripler using a subharmonic mixer and fundamental cancellation", IEEE Transactions on Microwave Theory Techniques, vol. 57, No. 5, pp. 1083-1090, May 2009.

* cited by examiner

# FREQUENCY TRIPLER AND LOCAL OSCILLATOR GENERATOR

CROSS REFERENCE TO RELATED APPLICATIONS

This application claims the priority of US Provisional Application No. 62/069,489, filed on Oct. 28, 2014, which is included herein by reference in its entirety.

BACKGROUND

In a conventional radio frequency (RF) system, a frequency tripler is built in a local oscillator (LO) generator to generate an output signal whose frequency is three times of an input frequency to prevent a power amplifier from pulling the oscillator. However, the output signal generated from the conventional frequency tripler includes a fundamental harmonic frequency or a second harmonic frequency, and these harmonic frequencies may influence operations of the following stages.

SUMMARY

It is therefore an objective of the present invention to provide a frequency tripler and associated LO generator, whose output signal does not include any fundamental harmonic frequency and any second harmonic frequency, to solve the above-mentioned problems.

According to one embodiment of the present invention, a frequency tripler comprises a double-frequency in-phase signal generator, a double-frequency quadrature signal generator and a mixer. The double-frequency in-phase signal generator is arranged for receiving at least an in-phase signal and a quadrature signal to generate a double-frequency in-phase signal whose frequency is twice that of the in-phase signal or the quadrature signal; the double-frequency quadrature signal generator is arranged for receiving at least the in-phase signal and the quadrature signal to generate a double-frequency quadrature signal whose frequency is twice that of the in-phase signal or the quadrature signal; and the mixer is arranged for receiving the in-phase signal, the quadrature signal, the double-frequency in-phase signal and the double-frequency quadrature signal to generate an output signal whose frequency is triple that of the in-phase signal or the quadrature signal.

According to another embodiment of the present invention, a local oscillator generator comprises a signal generator and a frequency tripler, where the frequency tripler comprises a double-frequency in-phase signal generator, a double-frequency quadrature signal generator and a mixer. The signal generator is arranged for generating at least an in-phase signal and a quadrature signal; the double-frequency in-phase signal generator is arranged for receiving at least the in-phase signal and the quadrature signal to generate a double-frequency in-phase signal whose frequency is twice that of the in-phase signal or the quadrature signal; the double-frequency quadrature signal generator is arranged for receiving at least the in-phase signal and the quadrature signal to generate a double-frequency quadrature signal whose frequency is twice that of the in-phase signal or the quadrature signal; and the mixer is arranged for receiving the in-phase signal, the quadrature signal, the double-frequency in-phase signal and the double-frequency quadrature signal to generate an output signal whose frequency is triple that of the in-phase signal or the quadrature signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
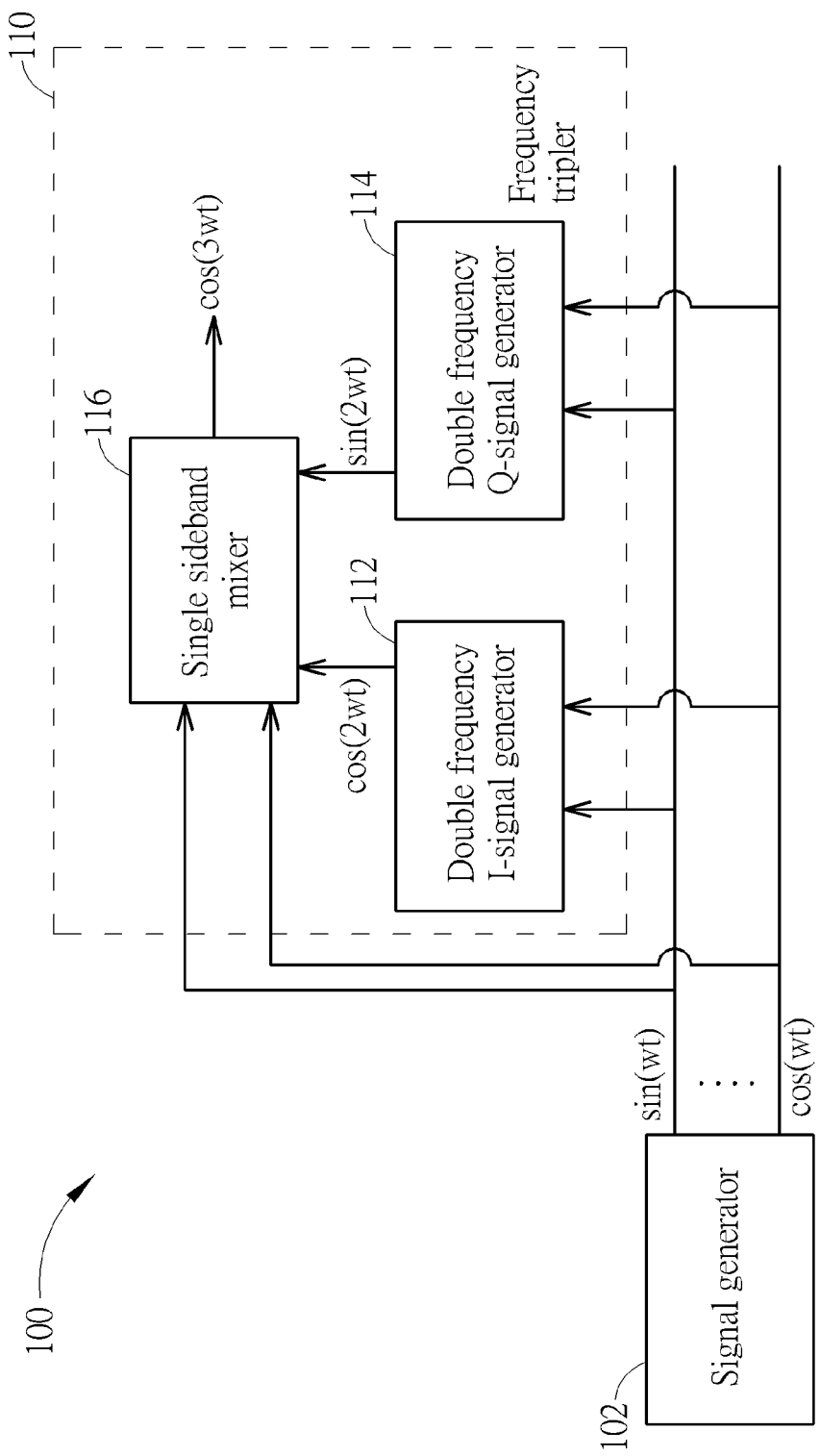
FIG. 1 is a diagram illustrating a local oscillator generator according to one embodiment of the present invention.

Please refer to FIG. 1, which is a diagram illustrating a local oscillator (LO) generator 100 according to one embodiment of the present invention. As shown in FIG. 1, the LO generator 100 comprises a signal generator 102 and a frequency tripler 110, where the frequency tripler 110 comprises a double-frequency in-phase signal generator 112, a double-frequency quadrature signal generator 114 and a mixer (in this embodiment, the mixer is implemented by a single sideband mixer 116). In this embodiment, the signal generator 102 may be implemented by a voltage-controlled delay line (VCDL), a poly phase filter, a quadrature voltage-controlled oscillator, a phase shifter, or any other circuit capable of generating in-phase and quadrature signals.

In the operations of the LO generator 100, the signal generator 102 is arranged to generate at least an in-phase signal cos ($\omega$t) and a quadrature signal sin ($\omega$t). In this embodiment, the signal generator 102 is arranged to generate four-phase IQ signals, that is four signals sin($\omega$t), cos ($\omega$t), −sin($\omega$t) and −cos($\omega$t). Then, the double-frequency in-phase signal generator 112 receives at least at least a portion of the IQ signals generated from the signal generator 102 to generate a double-frequency in-phase signal cos(2$\omega$t) whose frequency is twice that of the in-phase signal cos($\omega$t) and the quadrature signal sin($\omega$t); and the double-frequency quadrature signal generator 114 receives at least at least a portion of the IQ signals to generate a double-frequency quadrature signal sin(2$\omega$t) whose frequency is twice that of the in-phase signal cos($\omega$t) and the quadrature signal sin($\omega$t). Finally, the single sideband mixer 116 receives the in-phase signal cos($\omega$t), the quadrature signal sin ($\omega$t), the double-frequency in-phase signal cos(2$\omega$t) and the double-frequency quadrature signal sin(2$\omega$t) to generate an output signal cos(3$\omega$t) whose frequency is triple that of the in-phase signal cos($\omega$t) and the quadrature signal sin($\omega$t).

Figure 2:
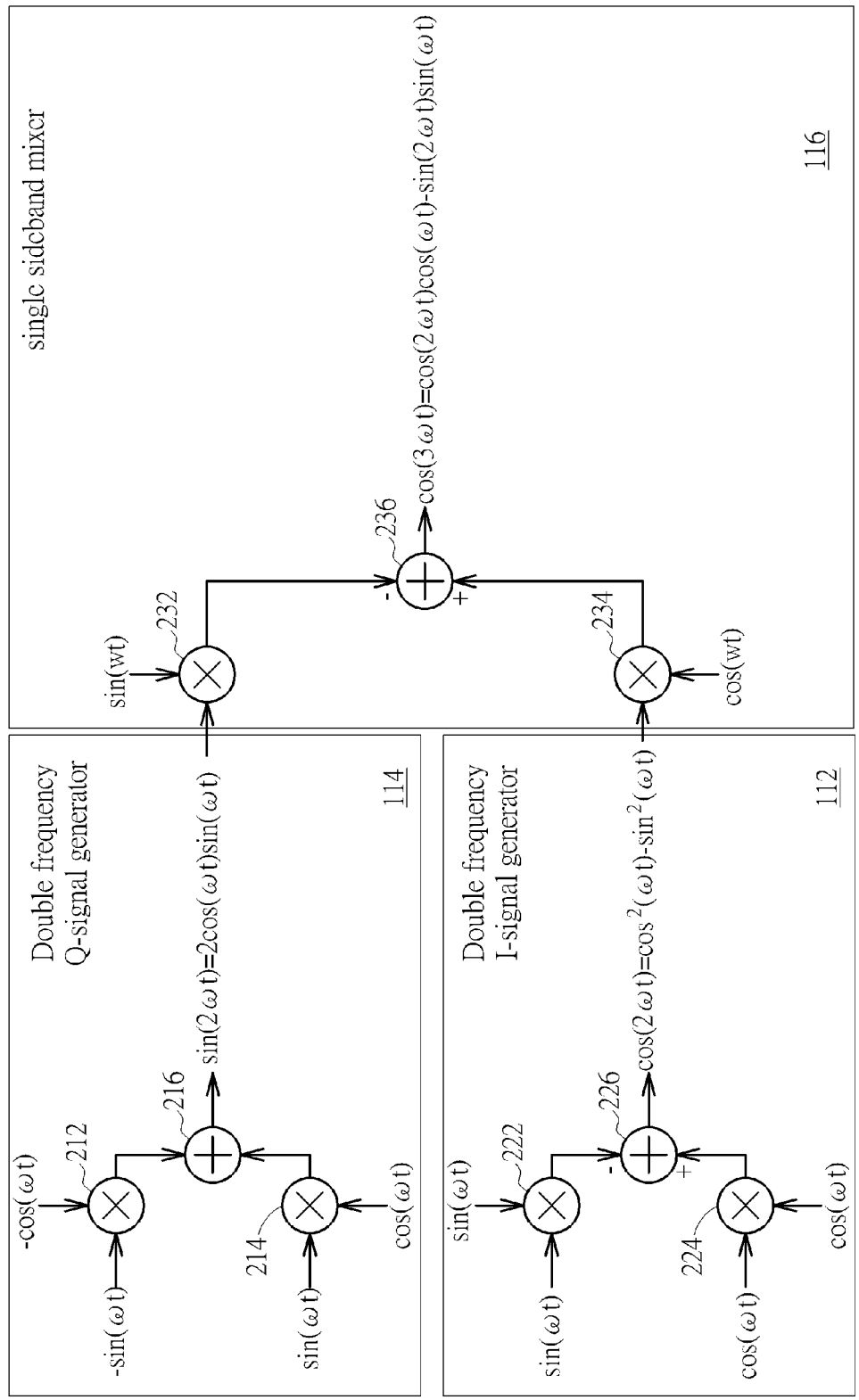
FIG. 2, which is a diagram illustrating operations of the frequency tripler according to one embodiment of the present invention.

Please refer to FIG. 2, which is a diagram illustrating operations of the frequency tripler 110 according to one embodiment of the present invention. As shown in FIG. 2, the double-frequency in-phase signal generator 112 comprises two multipliers 222, 224 and a combiner 226, where the multipliers 222, 224 and the combiner 226 are used to generate the double-frequency in-phase signal cos (2ωt) by using formula $\cos(2\omega t)=\cos^2(\omega t)-\sin^2(\omega t)$. In detail, the multiplier 222 multiplies sin(ωt) by sin(ωt) to generate $\sin^2(\omega t)$, the multiplier 224 multiplies cos(ωt) by cos(ωt) to generate $\cos^2(\omega t)$, and the combiner 226 subtracts $\sin^2(\omega t)$ from $\cos^2(\omega t)$ to obtain cos(2ωt). The double-frequency quadrature signal generator 114 comprises two multipliers 212, 214 and a combiner 216, where the multipliers 212, 214 and the combiner 216 are used to generate the double-frequency quadrature signal sin(2ωt) by using formula sin (2ωt)=2 cos(ωt)sin(ωt). In detail, the multiplier 212 multiplies −cos(ωt) by −sin(ωt) to generate cos(ωt)sin(ωt), the multiplier 214 multiplies cos (ωt) by sin (ωt) to generate cos(ωt)sin(ωt), and the combiner 216 combines outputs of the multipliers 212 and 214 to obtain sin (2ωt). The single sideband mixer 116 comprises two multipliers 232, 234 and a combiner 236, where the multipliers 232, 234 and the combiner 236 are used to generate the output signal by using formula cos(3ωt)=cos(2ωt)cos(ωt)−sin(2ωt)sin(ωt). In detail, the multiplier 232 multiplies sin(2ωt) by sin(ωt), the multiplier 234 multiplies cos (2ωt) by cos (ωt), and the combiner 216 subtracts sin(2ωt)sin(ωt) from cos(2ωt)cos (ωt) to obtain cos (3ωt). In the aforementioned operations of the frequency tripler 110, the output signal of the frequency tripler 110 does not have any fundamental harmonic frequency/spur or any second harmonic frequency/spur such as cos (ωt), sin(ωt), cos (2ωt) and/or sin(2ωt). Therefore, the frequency tripler 110 improves the situation of the output signal of the frequency tripler 110 and rejects fundamental/second harmonic spurs.

Figure 3:
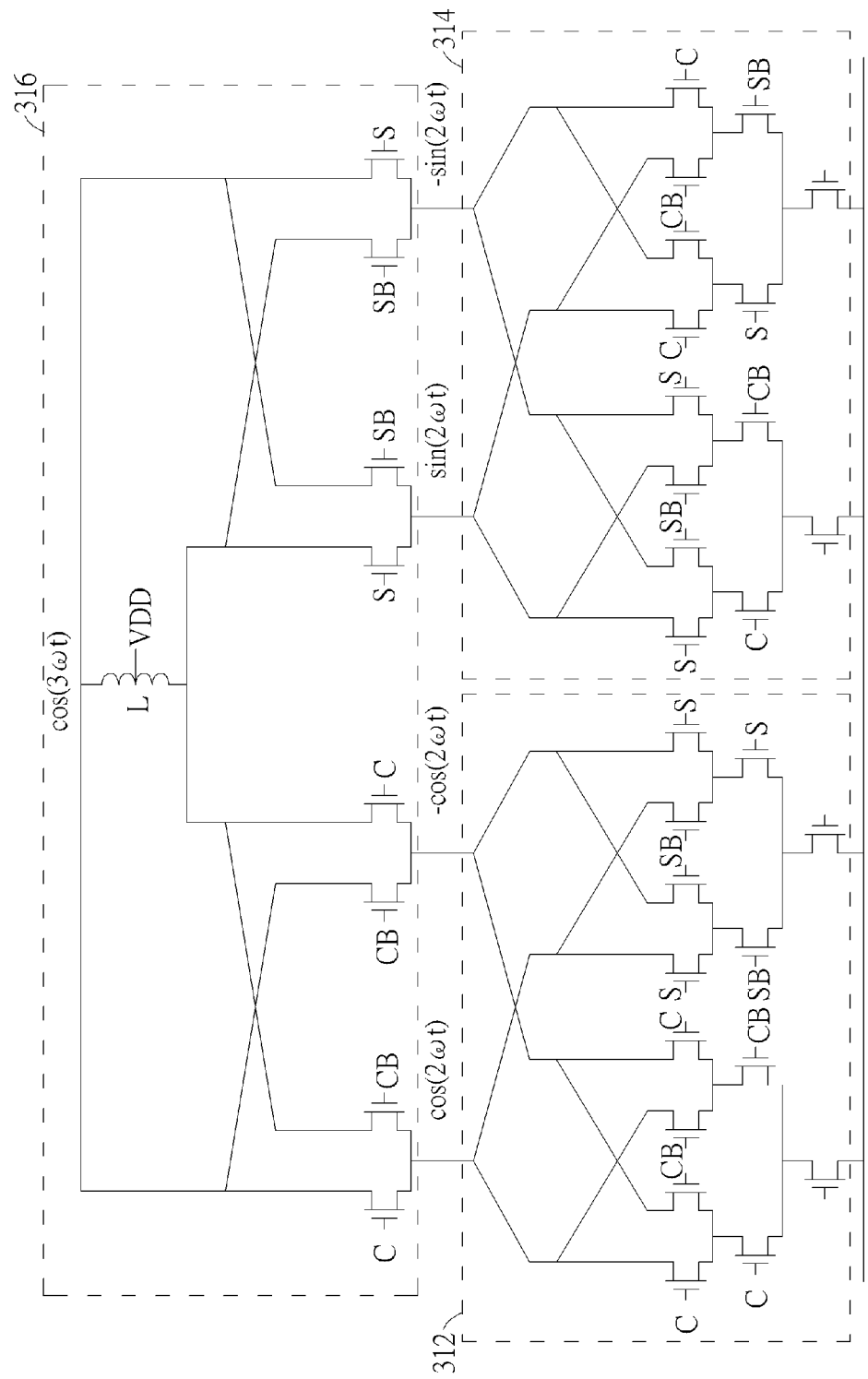
FIG. 3 shows a circuit structure of the frequency tripler according to one embodiment of the present invention.

FIG. 3 shows a circuit structure of the frequency tripler 110 according to one embodiment of the present invention. In FIG. 3, a plurality of transistors are arranged in cascoded structure to implement a double-frequency in-phase signal generator 312, a double-frequency quadrature signal generator 314 and a single sideband mixer 316 to generate the output signal cos(3ωt), where the symbols S, C, SB, CB correspond to sin(ωt), cos(ωt), −sin(ωt) and −cos(ωt) shown in FIG. 2, respectively, and the operations of the double-frequency in-phase signal generator 312 and the double-frequency quadrature signal generator 314 are similar to that of the double-frequency in-phase signal generator 112 and the double-frequency quadrature signal generator 114, but the two-phases outputs are implemented. By using the cascoded implementation of FIG. 3, the frequency tripler 110 can generate the output signal without any unwanted tone.

It is noted that an inductor L shown in FIG. 3 may be replaced by a resistor. In addition, the cascoded implementation shown in FIG. 3 is for illustrative purposes only, and is not a limitation of the present invention. In other embodiments, the frequency tripler 110 can be implemented by folded cascoded or two stages circuit structure. Because a person skilled in the art should understand how to implement the frequency tripler 110 by using folded cascoded or two stages circuit structure with reference to the disclosure in FIG. 2 and FIG. 3, further descriptions are omitted here.

In the frequency tripler 100 shown in FIG. 1-FIG. 3, the output signal cos(3ωt) is generated in response to the double-frequency in-phase signal and the double-frequency quadrature signal. In the aforementioned embodiment, the double-frequency in-phase signal and the double-frequency quadrature signal are therefore obtained first, and then, the triple frequency can be obtained without any unwanted tone. The power efficiency is thus improved. In addition, by using the single sideband mixer 116, the frequency tripler 110 is insensitive to input mismatch and has better performance in spur rejection.

Briefly summarized, in the frequency tripler of the present invention, the frequency tripler can generate the output signal without any unwanted tone (i.e. without any fundamental harmonic frequency/spur or second harmonic frequency/spur) based on trigonometric formula. Therefore, the frequency tripler is good at fundamental/second harmonic spur rejection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency tripler, comprising:
a double-frequency in-phase signal generator, for receiving at least an in-phase signal and a quadrature signal to generate a double-frequency in-phase signal with a frequency being twice that of the in-phase signal or the quadrature signal;
a double-frequency quadrature signal generator, for receiving at least the in-phase signal and the quadrature signal to generate a double-frequency quadrature signal with a frequency being twice that of the in-phase signal or the quadrature signal; and
a mixer, for receiving the in-phase signal, the quadrature signal, the double-frequency in-phase signal and the double-frequency quadrature signal to generate an output signal with a frequency being triple that of the in-phase signal or the quadrature signal;
wherein at least one of the double-frequency in-phase signal generator and the double-frequency quadrature signal generator receives an in-phase signal of a first phase, a quadrature signal of a second phase, a third signal of a third phase and a fourth signal of a fourth phase, each of the first, second, third and fourth phases being different from one another, and generates the double-frequency in-phase signal or the double-frequency quadrature signal based upon the in-phase signal, the quadrature signal, the third signal and the fourth signal.

2. The frequency tripler of claim 1, wherein the double-frequency in-phase signal is calculated by using formula $\cos(2\omega t)=\cos^2(\omega t)-\sin^2(\omega t)$, the double-frequency quadrature signal is calculated by using formula sin(2ωt)=2 cos (ωt)sin(ωt), wherein cos(ωt) is the in-phase signal, and sin(ωt) is the quadrature signal; and the mixer generates the output signal by using formula cos(3ωt)=cos(2ωt)cos(ωt)−sin(2ωt)sin(ωt).

3. The frequency tripler of claim 1, wherein the output signal generated by the mixer does not include any fundamental harmonic frequency/spur and any second harmonic frequency/spur.

4. The frequency tripler of claim 1, wherein the frequency tripler is implemented by cascoded, folded cascoded, or two-stage circuit structure.

5. The frequency tripler of claim 1, wherein the in-phase signal and the quadrature signal are generated from a voltage-controlled delay line (VCDL), a poly phase filter, a quadrature voltage-controlled oscillator, or a phase shifter.

6. The frequency tripler of claim 1, wherein the double-frequency in-phase signal generator and the double-frequency quadrature signal generator each receive the in-phase signal of the first phase, the quadrature signal of the second phase, the third signal of the third phase and the fourth signal of the fourth phase, and wherein the double-frequency in-phase signal generator generates the double-frequency in-phase signal based upon the in-phase signal, the quadrature signal, the third signal and the fourth signal and the double-frequency quadrature signal generator generates the double-frequency quadrature signal based upon the in-phase signal, the quadrature signal, the third signal and the fourth signal.

7. The frequency tripler of claim 1, wherein the in-phase signal, the quadrature signal, the third signal and the fourth signal are $\cos(\omega t)$, $\sin(\omega t)$, $-\cos(\omega t)$ and $-\sin(\omega t)$, respectively.

8. The frequency tripler of claim 1, wherein the double-frequency in-phase signal generator generates both $\cos(2\omega t)$ and $-\cos(2\omega t)$, and the double-frequency quadrature signal generator generates both $\sin(2\omega t)$ and $-\sin(2\omega t)$.

9. The frequency tripler of claim 8, wherein the mixer receives $\cos(\omega t)$, $\sin(\omega t)$, $-\cos(\omega t)$ and $-\sin(\omega t)$, receives $\cos(2\omega t)$ and $-\cos(2\omega t)$ from the double-frequency in-phase signal generator and receives $\sin(2\omega t)$ and $-\sin(2\omega t)$ from the double-frequency quadrature signal generator and generates the output signal using $\cos(\omega t)$, $\sin(\omega t)$, $-\cos(\omega t)-\sin(\omega t)$, $\cos(2\omega t)$, $-\cos(2\omega t)$, $\sin(2\omega t)$ and $-\sin(2\omega t)$.

10. A local oscillator generator, comprising:
a signal generator, for generating at least an in-phase signal and a quadrature signal; and
a frequency tripler, comprising:
a double-frequency in-phase signal generator, for receiving at least the in-phase signal and the quadrature signal to generate a double-frequency in-phase signal with a frequency being twice that of the in-phase signal or the quadrature signal;
a double-frequency quadrature signal generator, for receiving at least the in-phase signal and the quadrature signal to generate a double-frequency quadrature signal with a frequency is twice that of the in-phase signal or the quadrature signal; and
a mixer, for receiving the in-phase signal, the quadrature signal, the double-frequency in-phase signal and the double-frequency quadrature signal to generate an output signal with a frequency being triple that of the in-phase signal or the quadrature signal;
wherein at least one of the double-frequency in-phase signal generator and the double-frequency quadrature signal generator receives an in-phase signal of a first phase, a quadrature signal of a second phase, a third signal of a third phase and a fourth signal of a fourth phase, each of the first, second, third and fourth phases being different from one another, and generates the double-frequency in-phase signal or the double-frequency quadrature signal based upon the in-phase signal, the quadrature signal, the third signal and the fourth signal.

11. The local oscillator generator of claim 10, wherein the double-frequency in-phase signal is calculated by using formula $\cos(2\omega t)=\cos^2(\omega t)-\sin^2(\omega t)$, the double-frequency quadrature signal is calculated by using formula $\sin(2\omega t)=2\cos(\omega t)\sin(\omega t)$, wherein $\cos(\omega t)$ is the in-phase signal, and $\sin(\omega t)$ is the quadrature signal; and the mixer generates the output signal by using formula $\cos(3\omega t)=\cos(2\omega t)\cos(\omega t)-\sin(2\omega t)\sin(\omega t)$.

12. The local oscillator generator of claim 10, wherein the output signal generated by the mixer does not include any fundamental harmonic frequency/spur or second harmonic frequency/spur.

13. The local oscillator generator of claim 10, wherein the frequency tripler is implemented by cascoded, folded cascoded, or two-stage circuit structure.

14. The local oscillator generator of claim 10, wherein the signal generator is implemented by a voltage-controlled delay line (VCDL), a poly phase filter, a quadrature voltage-controlled oscillator, or a phase shifter.

15. The local oscillator generator of claim 10, wherein the double-frequency in-phase signal generator and the double-frequency quadrature signal generator each receive the in-phase signal of the first phase, the quadrature signal of the second phase, the third signal of the third phase and the fourth signal of the fourth phase, and wherein the double-frequency in-phase signal generator generates the double-frequency in-phase signal based upon the in-phase signal, the quadrature signal, the third signal and the fourth signal and the double-frequency quadrature signal generator generates the double-frequency quadrature signal based upon the in-phase signal, the quadrature signal, the third signal and the fourth signal.

16. The local oscillator generator of claim 10, wherein the in-phase signal, the quadrature signal, the third signal and the fourth signal are $\cos(\omega t)$, $\sin(\omega t)$, $-\cos(\omega t)$ and $-\sin(\omega t)$, respectively.

17. The local oscillator generator of claim 10, wherein the double-frequency in-phase signal generator generates both $\cos(2\omega t)$ and $-\cos(2\omega t)$, and the double-frequency quadrature signal generator generates both $\sin(2\omega t)$ and $-\sin(2\omega t)$.

18. The local oscillator generator of claim 17, wherein the mixer receives $\cos(\omega t)$, $\sin(\omega t)$, $-\cos(\omega t)$ and $-\sin(\omega t)$, receives $\cos(2\omega t)$ and $-\cos(2\omega t)$ from the double-frequency in-phase signal generator and receives $\sin(2\omega t)$ and $-\sin(2\omega t)$ from the double-frequency quadrature signal generator and generates the output signal using $\cos(\omega t)$, $\sin(\omega t)$, $-\cos(\omega t)-\sin(\omega t)$, $\cos(2\omega t)$, $-\cos(2\omega t)$, $\sin(2\omega t)$ and $-\sin(2\omega t)$.

* * * * *